United States Patent [19]

Nanda et al.

[11] Patent Number: 4,978,419
[45] Date of Patent: Dec. 18, 1990

[54] PROCESS FOR DEFINING VIAS THROUGH SILICON NITRIDE AND POLYAMIDE

[75] Inventors: Madan M. Nanda, Reston; Steven L. Peterman; David Stanasolovich, both of Manassas, all of Va.

[73] Assignee: International Business Machines Corporation, Armonk, N.Y.

[21] Appl. No.: 205,009

[22] Filed: May 31, 1988

Related U.S. Application Data

[63] Continuation-in-part of Ser. No. 917,350, Oct. 9, 1988, abandoned.

[51] Int. Cl.$^5$ ............................................. H01L 21/308
[52] U.S. Cl. ..................... 156/643; 156/646; 156/653; 156/657; 156/659.1; 156/668; 437/229; 437/241
[58] Field of Search ................................. 437/229, 241

[56] References Cited

U.S. PATENT DOCUMENTS

| | | | |
|---|---|---|---|
| 4,367,119 | 1/1983 | Logan et al. | 156/653 |
| 4,423,547 | 1/1984 | Farrar et al. | 156/653 |
| 4,430,153 | 2/1984 | Gleason et al. | 156/644 |
| 4,447,290 | 5/1984 | Matthews | 156/662 |
| 4,487,652 | 12/1984 | Almgren | 156/644 |
| 4,495,220 | 1/1985 | Wolf et al. | 156/644 |
| 4,497,684 | 2/1985 | Sebesta | 252/79.3 |
| 4,519,872 | 5/1985 | Anderson, Jr. et al. | 156/661.1 |
| 4,523,976 | 6/1985 | Bukhman | 156/643 |
| 4,545,851 | 10/1985 | Takada | 156/643 |
| 4,618,878 | 10/1986 | Aoyama et al. | 357/72 |
| 4,758,306 | 7/1988 | Cronin et al. | 156/645 |

Primary Examiner—David Simmons
Assistant Examiner—Lori-Ann Johnson
Attorney, Agent, or Firm—Jesse L. Abzug

[57] ABSTRACT

A process for defining vias through a polyimide and silicon nitride layer is disclosed. After the deposition of a first layer of silicon nitride and a second layer of polyimide, a layer of photoresist capable of producing negatively sloped walls is then lithographically defined with a pattern of vias. After the photoresist is developed, the polyimide layer is etched with a $CF_4O_2$ gas mixture using the developed photoresist layer as etch mask. The silicon nitride layer is then etched with a $CF_4/H_2$ gas mixture using the etched polyimide layer as an etch mask.

4 Claims, 2 Drawing Sheets

PROCESS FOR DEFINING VIAS THROUGH SILICON NITRIDE AND POLYAMIDE This application is a continuation-in-part of Ser. No. 917,350, filed Oct. 9, 1986, now abandoned.

BACKGROUND OF THE INVENTION

1. Technical Field

This invention is related to a process for defining vias through polyimide and silicon nitride layers for making circuit interconnections in an integrated circuit.

2. Background Art

In the fabrication of very large scale integrated circuits (VLSI), it is sometimes necessary to make circuit interconnections between layers of metallization which are separated by one or more layers of insulating material. In the case of an integrated circuit as shown in FIG. 1 in which contact metal layer 10 is sequentially covered by a layer 12 of silicon nitride and then a layer 14 of polyimide, it is necessary to define vias 16 through both of these layers to make circuit interconnections with additional metal layers that are subsequently deposited.

It is known in the art to define vias using the following process steps: (1) apply photoresist layer; (2) lithographically define the via pattern; and (3) etch the underlying layer with an appropriate wet or dry etchant. When necessary to define vias through two layers, the above process steps are repeated for the second layer.

The problem, however, is that with the tolerances inherent in current technologies, it is very difficult to align the vias in each of the respective layers. To ensure that the vias do coincide to the extent necessary for adequate metallization, it is necessary to make the vias in each layer significantly larger than what would ordinarily be necessary as seen in FIG. 1. In VLSI applications, this would consume a large amount of real estate on a semiconductor chip.

It is therefore desirable to have a process for defining vias through both a silicon nitride and a polyimide layer in a self-aligned manner such that the wasted space on the chip is avoided.

OBJECTS OF THE INVENTION

It is an object of this invention to provide a process for defining vias through a silicon nitride and polyimide layer.

It is an additional object to provide a process for defining vias through a silicon nitride and polyimide layer such that the vias are self-aligned so that no unnecessary chip area is used.

It is a further object to provide a process for defining vias through a silicon nitride and polyimide layer wherein only one masking and lithographic step is required, thereby reducing the number of process steps necessary.

SUMMARY OF THE INVENTION

In accordance with these objects, the following process can be used to simultaneously define vias through a polyimide and silicon nitride layer:

1. Provide a substrate having a first layer of silicon nitride and a second layer of polyimide;

2. Deposit a layer of photoresist capable of producing negatively sloped profiles;

3. Lithographically define a pattern of vias in the photoresist;

4. Develop the photoresist to produce a pattern of vias having negatively sloped profiles;

5. Etch the polyimide layer using the developed photoresist layer as an etch mask with a $CF_4/O_2$ gas mixture; and 6. Etch the silicon nitride layer using the etched polyimide layer as an etch mask with a $CF_4/H_2$ gas mixture.

BRIEF DESCRIPTION OF THE DRAWINGS

The foregoing and other advantages of the invention will be more fully understood with reference to the description of the best mode and the drawing wherein.

DESCRIPTION OF THE BEST MODE FOR CARRYING OUT THE INVENTION

Figure 1:
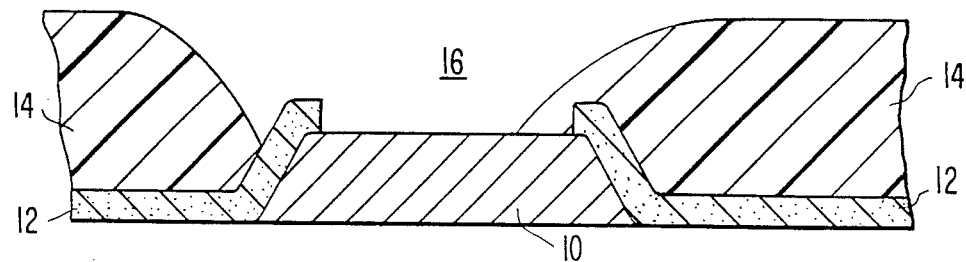
FIG. 1 is a cross-sectional view of a semiconductor chip showing a prior art method of defining vias through two insulating layers.
Figure 2A:
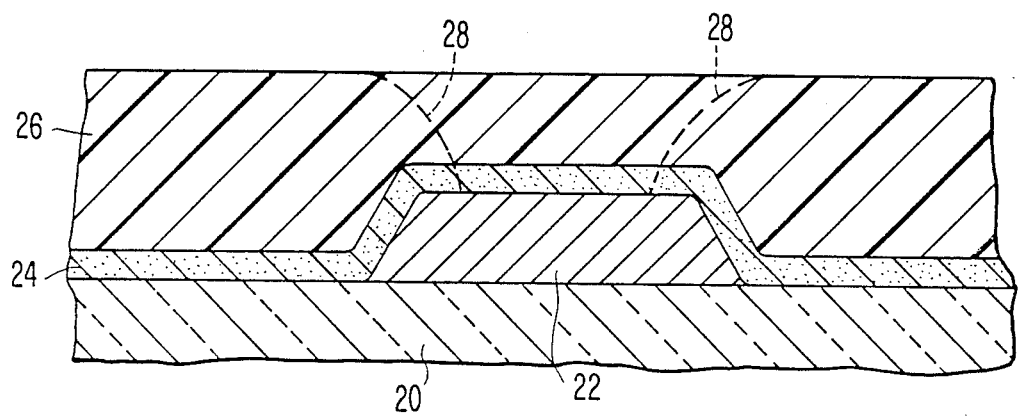
FIGS. 2A–E are cross-sectional views of a semiconductor chip showing the process steps for defining vias through two insulating layers according to this invention.

A cross-sectional view of a portion of a semiconductor chip is shown schematically in FIG. 2A. Substrate 20, represents that portion of the semiconductor chip that has been processed prior to the deposition of metal, or other types of device interconnect lines. Already deposited on substrate 20 are the first level metallurgy 22. The metal chosen for first level metallurgy 22 is not critical to this invention and can be any metal that is commonly used for this purpose. It is very common to design VLSI circuits in which several levels of interconnect metallurgy are required. To eliminate short circuits between metal levels, insulation or passivation layers are deposited between the metal levels. In this best mode, a thin conformal layer of silicon nitride 24 approximately 0.2–1.0 microns thick is first deposited over substrate 20 and metal lines 22. The method used to deposit the silicon nitride can include chemical vapor deposition, or any other technique commonly used for this purpose. On top of silicon nitride layer 24, a planarizing layer of polyimide 26 is deposited. The polyimide can be spun or sprayed on as is well-known in the art with a thickness in the range of 0.4–2.5 microns.

In order to make electrical contact between first level metal 22 and a subsequent level of metal (not shown) it is necessary to define a via through silicon nitride layer 24 and polyimide layer 26 with a profile as shown by dotted lines 28. The gradual slope of the via is necessary in order to ensure continuous metal coverage.

Figure 2B:
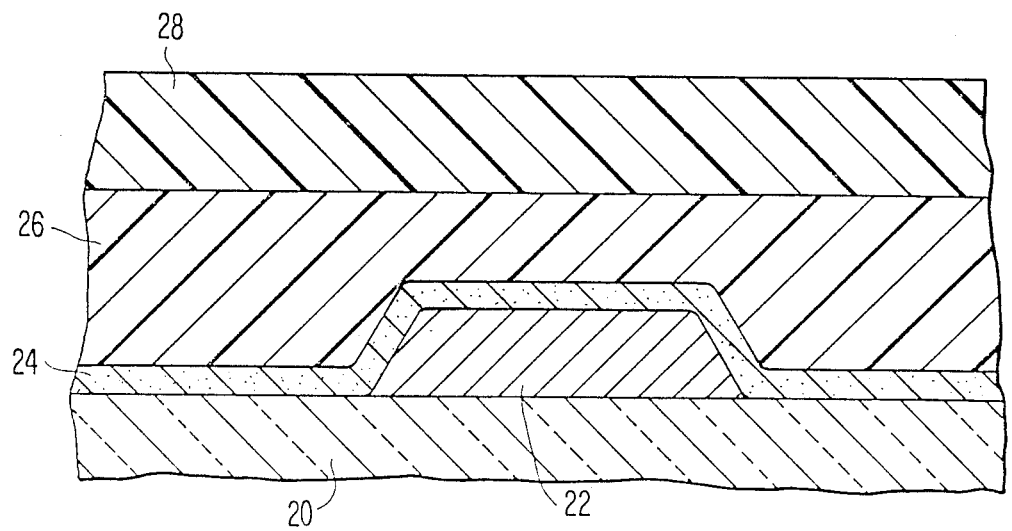
Figure 2C:
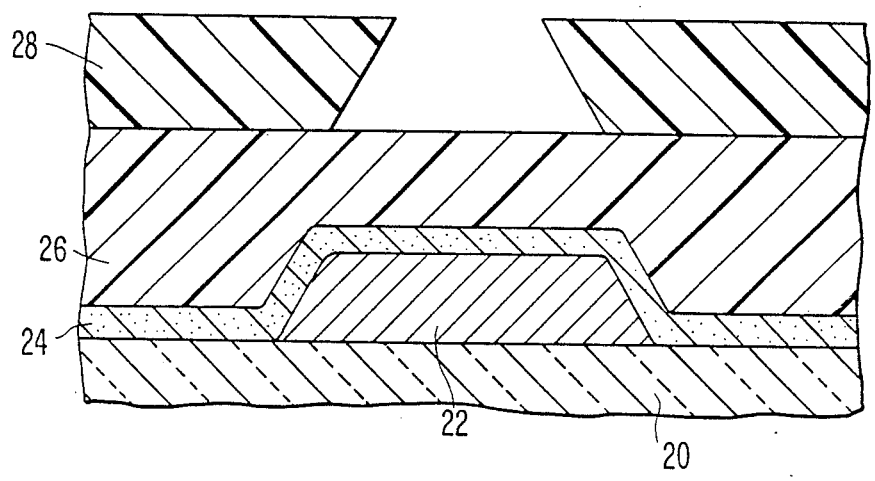

The first step in the via definition process is the deposition of a layer of photoresist 28 as seen in FIG. 2B. The thickness of the photoresist layer 28 is preferably in the range 1.0 to 2.5 microns. The choice of photoresist is likewise not critical but should be one that is capable of producing an image having a negative profile as shown in FIG. 2C, and is relatively etch resistant. A positive photoresist with an additive such as imidazole has been used with excellent results.

Still looking at FIG. 2C, the photoresist layer 28 is exposed to radiation through a mask (not shown) as conventionally done, and then developed, leaving the structure as shown in FIG. 2C.

Using the developed photoresist layer 28 as an etch mask, the polyimide layer 26 is reactive ion etched with the following process conditions:

Power density—0.10 watts per centimeter square
$CF_4$ mass flow rate—6–10 sccm

O₂ mass flow rate—85-100 sccm
Pressure—25-40 mtorr

Figure 2D:
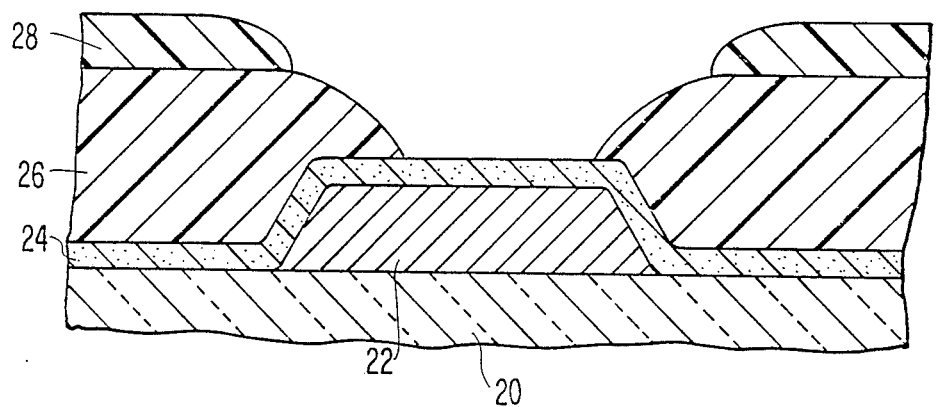
Figure 2E:
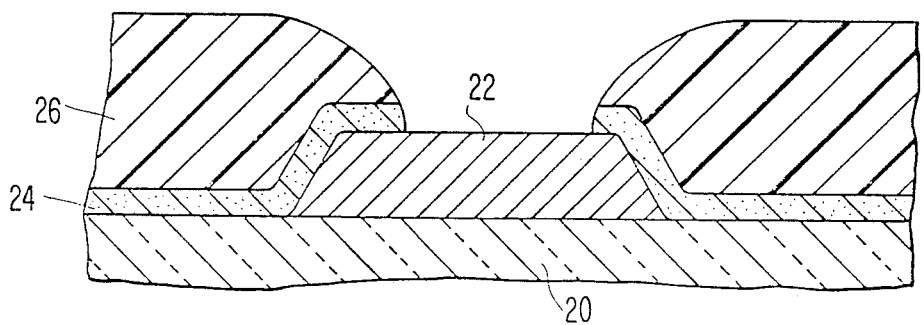

The resulting structure is shown in FIG. 2D. The via through silicon nitride layer 24 is next defined with another reactive ion etch process with the following parameters:

Power density—0.25 watts per centimeter square
CF₄ mass flow rate—80-83 sccm
H₂ mass flow rate—15-19 sccm
Pressure—20-35 mtorr The final structure after resist strip is shown in FIG. 2E. Due to the negligible organic etch rate with the CF₄/H₂ process conditions, the dimensions and the profile of the polyimide are maintained. The final structure is now ready for the deposition of a second level of metal.

EXAMPLE

Following the fabrication of semiconductor devices on a substrate, a first level of interconnection metallurgy was formed and patterned. A blanket layer of Si₃N₄ was next deposited using plasma enhanced chemical vapor deposition. The nominal thickness of the Si₃N₄ was approximately 0.4 microns.

A layer of polyimide was spun-on over the Si₃N₄ layer and baked at 350° C. for 30 minutes. The nominal thickness of the polyimide layer 0.6 microns to 1.3 microns due to the non-uniform underlying topography and planarizing effects of the polyimide layer.

Following the polyimide deposition, a layer of positive diazonovolak-based photoresist containing 1% by weight imidazole as an image reversal additive was spun-on and baked to a final thickness of approximately 2.2 microns. The photoresist was then exposed to UV light through a mask having a pattern of contacts. The exposed photoresist was then baked for 25 minutes at 100 degrees C. The baked resist was then blanket exposed to UV radiation at an intensity of approximately 880-1400 mj/cm². The exposed pattern was then developed using 0.23N KOH as well-known in the art.

Using the developed photoresist layer as an etch mask, the polyimide layer and Si₃N₄ layer were etched in a reactive ion etcher using the etching parameters previously described to open up self-aligned contact holes to the underlying layers.

While the invention has been shown with reference to a best mode, it would be obvious to one skilled in the art that the process can be used for defining vias through polyimide and silicon nitride for other applications without departing from the spirit and scope of the invention. Therefore, the invention should only be limited as specified in the claims.

What is claimed is:

1. In an integrated circuit chip having a plurality of semiconductor devices, a process for defining self-aligned vias through a silicon nitride layer and a polyimide layer comprising the following steps in the following order:
   depositing a layer of silicon nitride over said semiconductor devices, said silicon nitride layer having a thickness in the range 0.2–1.0 microns;
   depositing a layer of polyimide over said silicon nitride layer, said polyimide layer having a thickness greater than said silicon nitride layer and being in the range 0.6–2.5 microns;
   depositing a layer of photoresist capable of forming sidewalls having a negative profile over said polyimide layer, said layer of photoresist having a thickness greater than said polyimide layer;
   patternwise exposing said photoresist layer to radiation;
   developing the exposed photoresist layer to form an image having negatively sloped sidewalls;
   etching the silicon nitride layer with a mixture of CF₄ and O₂ using the patterned photoresist layer as an etch mask; and
   etching the silicon nitride layer with a mixture of CF₄ and H₂, using the etched polyimide layer as an etch mask.

2. The process as claimed in claim 1 wherein the photoresist is a positive photoresist containing an imidazole additive.

3. A process for defining vias through a silicon nitride layer and a polyimide layer comprising the following steps in the following order:
   depositing a layer of silicon nitride on a substrate, said silicon nitride layer having a thickness in the range 0.2–1.0 microns;
   depositing a layer of polyimide over said silicon nitride layer, said polyimide layer having a thickness greater than said silicon nitride layer and being in the range 0.6–2.5 microns;
   depositing a layer of photoresist capable of forming sidewalls having a negative profile over said polyimide layer, said layer of photoresist having a thickness greater than said polyimide layer;
   lithographically defining an image in said photoresist layer having negatively sloped sidewalls;
   etching the polyimide layer with a mixture of CF₄ and O₂ using the photoresist layer as an etch mask; and
   etching the silicon nitride layer with a mixture of CF₄ and H₂, using the etched polyimide layer as an etch mask.

4. The process as claimed in claim 3 wherein the photoresist is a positive photoresist containing an imidazole additive.

* * * * *